United States Patent [19]
Baillargeon et al.

[11] Patent Number: 6,137,817
[45] Date of Patent: Oct. 24, 2000

[54] QUANTUM CASCADE LASER

[75] Inventors: James Nelson Baillargeon, Springfield; Federico Capasso, Westfield; Alfred Yi Cho, Summit; Claire F. Gmachl, Short Hills; Albert Lee Hutchinson, Piscataway; Deborah Lee Sivco, Warren; Alessandro Tredicucci, Summit, all of N.J.

[73] Assignee: Lucent Technologies Inc., Murray Hill, N.J.

[21] Appl. No.: 09/096,701

[22] Filed: Jun. 12, 1998

[51] Int. Cl.$^7$ .................................................. H01S 5/00
[52] U.S. Cl. ............................. 372/45; 372/96; 356/437
[58] Field of Search .................................. 372/45, 43–46, 372/48, 20, 96

[56] References Cited

U.S. PATENT DOCUMENTS

| | | | |
|---|---|---|---|
| 5,457,709 | 10/1995 | Capasso et al. | 372/45 |
| 5,509,025 | 4/1996 | Capasso et al. | 372/45 |
| 5,727,010 | 3/1998 | Capasso et al. | 372/45 |

FOREIGN PATENT DOCUMENTS

| | | | |
|---|---|---|---|
| 0797280A1 | 9/1997 | European Pat. Off. | H01S 3/18 |
| 0841731A1 | 5/1998 | European Pat. Off. | H01S 3/18 |
| 63-182550 | 7/1988 | Japan | G01N 21/39 |

OTHER PUBLICATIONS

Tredicucci, A. et al., *Applied Physics Letters*, "High–Power Inter–Miniband Lasing in Intrinsic Superlattices", vol. 72, No. 19, pp. 2388–2390, May 11, 1998.
Sirtoit, C. et al., *Proceedings of the Conference on Lasers and Electro–Optics (CLEO)*, "Resonant Tunneling Electron Injection in Quantum Cascade Lasers", vol. 6, pp. 241–342, May 3–8, 1998.
Gmachl, C. et al. *Applied Physics Letters*, "High–Power Lambda 8 MUM Quantum Cascade Lasers with Near Optimum Performance", vol. 72, No. 24, pp. 3130–3132, Jun. 15, 1998.
Gmachl, C. et al. *Applied Physics Letters*, "Continuous–Wave and High–Power Pulsed Operation of Index–Coupled Distributed Feedback Quantum Cascade Laser at Lambda= 8.5 MUM", vol. 72, No. 12, pp. 1430–1432, Mar. 23, 1998.
Li, et al., *Electronics Letters*, "Intersubband Electroluminescence in GaAs/AlGaAs Quantum Cascade Structures", vol. 33, No. 22, pp. 1874–1875, Oct. 23, 1997.
"High Power Mid–Infrared ($\lambda$~5 $\mu$m) Quantum Cascade Lasers Operating Above Room Temperature", by J. Faist et al., *Applied Physics Letters*, vol. 68 (26), Jun. 24, 1996, pp. 3680–3682.
"High–Power Continuous–Wave Quantum Cascade Lasers", by J. Faist et al., *IEEE Journal of Quantum Electronics*, vol. 34, No. 2, Feb. 1998, pp. 336–341.
"Distributed Feedback Quantum Cascade Lasers", by J. Faist et al., *Applied Physics Letters*, vol. 70 (20), May 19, 1997, pp. 2670–2672.
"Complex–Coupled Quantum Cascade Distributed–Feedback Laser", by C. Gmachl et al., *IEEE Photonics Technology Letters*, vol. 9, No. 8, Aug. 1997, pp. 1090–1092.
"Mid–Infrared (8.5 $\mu$m) Semiconductor Lasers Operating at Room Temperature", by C. Sirtori et al., *IEEE Photonics Technology Letters*, vol. 9, No. 3, Mar. 1997, pp. 294–296.
U.S. Patent application J. N. Baillargeon 4–45–77–9–1–10–14, Ser. No. 08/852,646, filed May 7, 1997.
U.S. Patent application F. Capasso 44–75–8–12–1–9–13, Ser. No. 08/744,292, filed Nov. 6, 1996.

*Primary Examiner*—Frank G. Font
*Assistant Examiner*—Gioacchino Inzirillo
*Attorney, Agent, or Firm*—Eugene E. Pacher

[57] ABSTRACT

A novel quantum cascade (QC) laser comprises a multiplicity of identical repeat units, with each repeat unit comprising an active region and an injector region. The injector region comprises quantum wells and barriers, selected to facilitate, under appropriate bias, resonant carrier transport from a lower energy level of a given active region to an upper energy level of an adjacent downstream active region. Carrier transition from the upper energy level to a lower energy level of an active region results in emission of infrared radiation. The laser is advantageously used in, e.g., a measurement system for detection of trace compounds in air.

8 Claims, 3 Drawing Sheets

QUANTUM CASCADE LASER

GOVERNMENT CONTRACT

This invention was made with Government support under contract No. DAAH04-96-C-0026 with the Army Research Office. The Government has certain rights in this invention.

FIELD OF THE INVENTION

This application pertains to quantum cascade (QC) lasers.

BACKGROUND

Quantum cascade (QC) lasers are known. See, for instance, U.S. Pat. Nos. 5,457,709 and 5,509,025. See also J. Faist et al, *Applied Physics Letters*, Vol. 68, p. 3680 (1996), all incorporated herein by reference.

Briefly, a prior art QC laser comprises a multiplicity of identical "repeat units", each repeat unit comprising an active region and an injector/relaxation region. With each active region is associated an upper and at least one lower energy level. Under an applied field, charge carriers (typically electrons) migrate from a lower energy level of a given active region through an injector/relaxation region to the upper energy level of the adjacent downstream active region, followed by a radiative transition from the upper to a lower level of the active region, then proceeding through an injector/relaxation region into the next active region, and so on. Thus, each charge carrier that is introduced into the relevant portion of the QC laser ideally undergoes N transitions (N being the number of repeat units, about 25, for instance), each such transition resulting in emission of a photon of wavelength $\lambda$, typically in the midinfrared (exemplarily 3–13 $\mu$m).

A variety of QC designs have been disclosed. For instance, the above referenced '025 patent discloses a design with "vertical" transition, i.e., a transition from an upper to a lower energy level of a given quantum well (QW), and U.S. patent application Ser. No. 08/744,292, filed Nov. 6, 1996 by Capasso et al. discloses a design with superlattice (SL) active region.

A variety of injector/relaxation (I/R) region designs have also been disclosed. See, for instance, U.S. Pat. No. 5,727,010, which discloses a chirped superlattice (SL) I/R region.

Considerable performance improvement has been achieved since the invention of the QC laser in about 1994. For instance, J. Faist et al., *IEEE Journal of Quantum Electronics*, Vol. 34, p. 336 (1998), disclose a QC laser emitting at $\lambda\sim5$ $\mu$m with continuous wave output power of 200 mW/facet at 80K. The laser had a modulation-doped "funnel" injector and a three-well vertical transition active region.

In view of the considerable economic and technological potential of QC lasers (e.g., for a variety of sensing and monitoring applications), it would be desirable to find still further ways to improve the performance of QC lasers. This application discloses such a further way.

GLOSSARY AND DEFINITIONS

An energy level in the active region of a given repeat unit is in "resonance" with an energy level of the active region of an adjacent downstream repeat unit if the two energy levels are at substantially the same energy, and the semiconductor region between the two active regions is selected to facilitate high electron transport through the injector region from the energy level of the given repeat unit to the equi-energetic energy level of the adjacent downstream repeat unit.

Two energy levels herein have "substantially the same energy" if the levels are aligned such that there is overlap between the broadened energy levels. The broadening of an energy level can be readily determined, and typically is a few meV (e.g., about 3 meV), generally less than 10 meV.

The injector region facilitates "high electron transport" through the injector if the average electron transit time through the injector region is less than or equal to the scattering time of the electrons in the injector region.

SUMMARY OF THE INVENTION

In a broad aspect the invention is embodied in an article (e.g., a monitoring or measuring system) that comprises an improved QC laser.

More specifically, the QC laser comprises, in sequence, an upper optical confinement region, a waveguide core region and a lower optical confinement region, and further comprises contacts for electrically contacting the laser. The waveguide core region comprises a multiplicity of essentially identical repeat units, a given repeat unit comprising an injector region and an active region selected to facilitate a radiative carrier transition from an upper to a lower energy level of the active region. The injector comprises a multiplicity of quantum well layers, with barrier layers interleaved between the quantum well (QW) layers. The QW layers and barrier layers of the injector region are selected to facilitate, under appropriate electrical bias, charge carrier passage from a lower energy state of a given active region to the upper energy state of the adjacent downstream active region.

Significantly, the QW layers and barrier layers are selected such that, under a first applied bias, a lower energy level of the given active region is in resonance with the upper energy level of the adjacent downstream active region, such that carrier transfer from the lower energy level of the given active region to the upper energy level of the adjacent downstream active region is facilitated.

In a preferred embodiment, the QW layers and barrier layers are furthermore selected such that, under an applied second bias larger than the first bias, there is resonant charge carrier injection from the ground state of the injector region of the given repeat unit into the upper energy level of the active region of the adjacent downstream repeat unit.

BRIEF DESCRIPTION OR THE DRAWINGS

FIG. 1 schematically depicts an exemplary QC laser;

The drawings are not intended to be to scale or in proportion.

DETAILED DESCRIPTION OF AN EXEMPLARY EMBODIMENT

Figure 1:
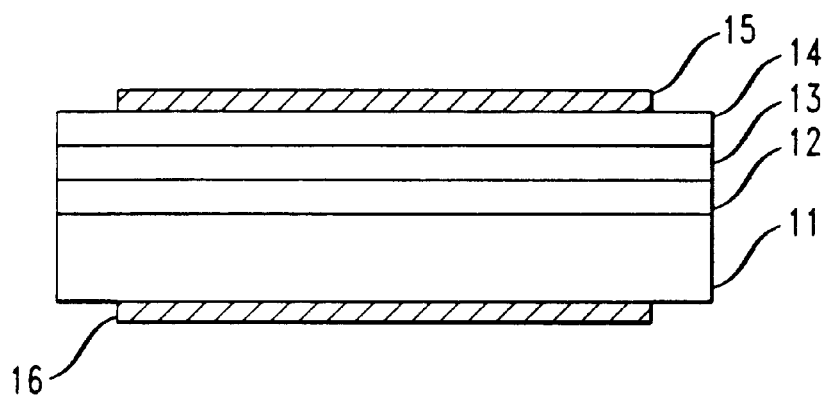

FIG. 1 schematically depicts an exemplary QC laser 10. Numerals 11–16 designate, respectively, substrate (e.g., InP), lower optical confinement region, waveguide core region, upper optical confinement region, upper contact and lower contact. Optionally the substrate can serve as lower optical confinement region.

Figure 2:
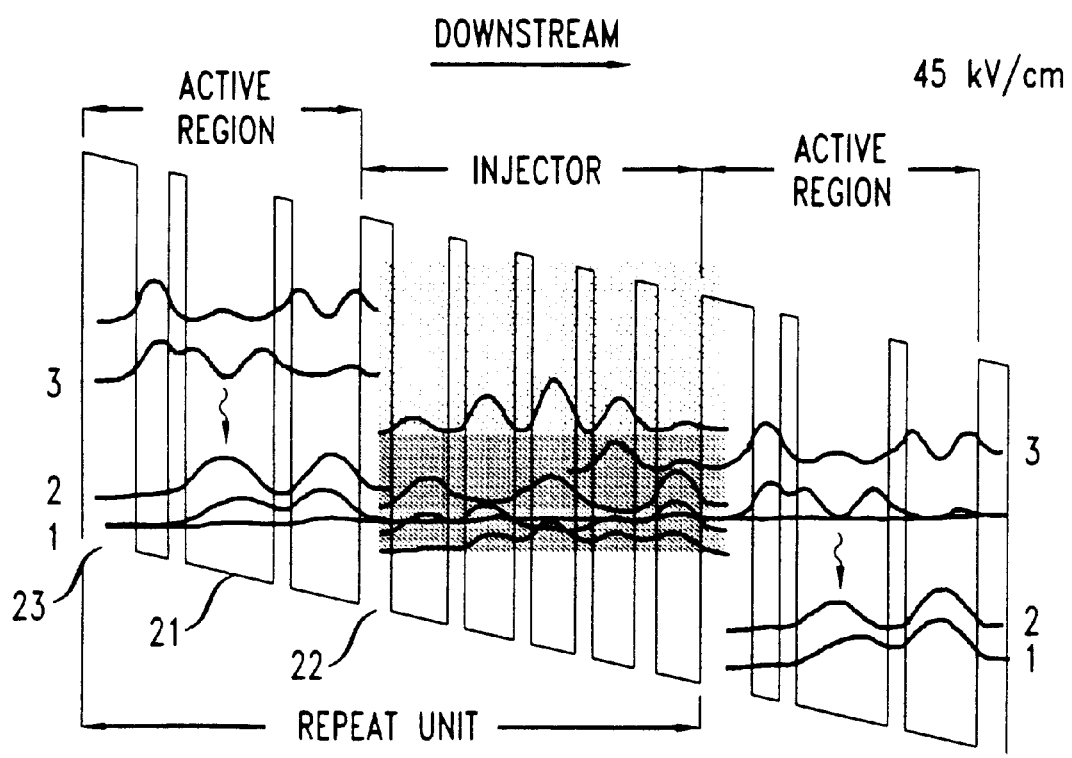
FIGS. 2 and 3 show the conduction band edge of a repeat unit (plus adjacent downstream active region) of an exemplary QC laser according to the invention, under applied field of 45 kV/cm and 65 kV/cm, respectively.

FIG. 2 schematically shows the conduction band edge of a complete repeat unit and the adjacent downstream active region of an exemplary QC laser according to the invention at a bias corresponding to an electric field of 45 kV/cm. The multilayer waveguide core region is lattice matched with InP, with InGaAs QWs (e.g., 21) and AlInAs barrier layers (e.g., 22). The active regions exemplarily comprise three QWs, closely coupled by thin barrier layers. FIG. 2 also shows the moduli squared of the wavefunctions that are involved in the laser transition, with numeral 1 referring to the ground state of the active region, 2 referring to the lower laser level, and 3 referring to the upper laser level. Above level 3 is shown a further level of the active region that is not involved in the operation of the exemplary QC laser. The wavy arrows from level 3 to level 2 indicate the laser transitions.

FIG. 2 also shows the moduli squared of the wavefunctions in the injector. The multiplicity of energy states in the darkened region constitutes a "miniband" that facilitates the transport of electrons (of appropriate energy) through the injector, and the region of reduced density of states (indicated by light shading) is a "minigap" that prevents electron tunneling out of level 3 of the active region. FIG. 2 also shows the essentially complete alignment (in energy) of ground state 1 of the given active region with level 3 of the downstream active region, with the "miniband" facilitating electron transport from the given active region to the downstream active region. The electric field of 45 kV/cm at resonance was deduced from the laser operating voltage at threshold (at low temperatures) under the assumption that the field is homogeneous across the multiplicity of repeat units.

In an exemplary QC laser according to the invention, the repeat unit had the below listed layer sequence, starting with injection barrier 23, the left-most layer in FIG. 2, and proceeding in the downstream direction. The layer thicknesses are in nanometers. Layers with underlined thickness are Si-doped $2 \times 10^{17}$ cm$^{-3}$. All other layers are undoped (i.e., not intentionally doped). The sequence was:

3.8/2.1/1.2/6.5/1.2/5.3/2.3/4.0/1.1/3.6/1.2/3.2/1.2/3.0/1.6/3.0

In the QC laser with the above described repeat unit, under a bias field of 45 kV/cm, the upper laser level (level 3) is separated from the lower laser level (level 2) by $E_{32} \sim 153.6$ meV, corresponding to $\lambda \sim 8.08$ μm. The longitudinal optical (LO) phonon scattering time $\tau_{32}$ between the two levels is calculated as 3.1 ps, and the matrix element of the optical transition as $d_{32} \sim 1.9$ nm. The lower laser level is closely coupled to the ground state (level 1) of the active material, such that the two levels are strongly anti-crossed. This increases the matrix element $d_{32}$ with respect to $d_{31}$, and maximizes $\tau_{32}$ with respect to $\tau_{31}$. The energy difference is $E_{21} \sim 38.3$ meV, designed to efficiently deplete the lower laser level of electrons via resonant LO-phonon scattering ($E_{LO} \sim 34$ meV). The corresponding lifetime is calculated as $\tau_2 \sim \tau_{21} \sim 0.3$ ps $<< \tau_{32} \sim 3.1$ ps, so that population inversion between levels 3 and 2 is readily achieved. The LO-phonon scattering time from level 3 to level 1 is $\tau_{31} \sim 3.6$ ps, and the scattering time into the states of the injector is estimated as $\tau_{3i} \sim 14.6$ ps.

In the exemplary QC laser of FIG. 2, the injector "miniband" (that is to say, the manifold of energy levels in the injector region) has been designed as "flat", in contrast to the "funnel" injector of prior art designs. The flat injector is characterized by a symmetric arrangement of the electron wavefunctions (shown as moduli squared in FIG. 2). The ground level of the injector is located about 40 meV in energy below the upper laser level. Even the next higher level of the injector miniband is energetically lower (about 14 meV) than the upper laser level. Doping of the center portion of the injector region provided an electron sheet density of n$\sim 1.6 \times 10^{11}$ cm$^{-2}$ per repeat unit, resulting in a quasi-Fermi-level of about 7.5 meV under operating conditions. The above described layer sequence implies that at laser threshold (45 kV/cm), electrons are not injected from the Fermi surface into the upper laser level. Furthermore, level 1 of a given active region is in resonance with level 3 of the adjacent downstream active region, allowing for resonant carrier transport between successive active regions without significant carrier relaxation in the injector. The estimated transit time through a given injector (length 21.9 nm, "width" of the miniband ~150 meV) of the exemplary QC laser is about 0.5 ps. In comparison, the relaxation time within the injector is long since the energy separation to the adjacent lower energy level is well below the LO-phonon energy, and the ground level of the injector region is partly filled with electrons.

Among the advantages of the above described exemplary QC laser is that it can avoid too early "shut-down" of the laser due to suppression of resonant tunneling. In prior art QC lasers (typically having a "funnel" injector) the upper laser level typically is filled with electrons by resonant tunneling only from the injector ground state. As a consequence, with increasing applied electric field (i.e., at high current operation) these two levels are subject to misalignment and the laser may shut off. On the other hand, in QC lasers according to the instant invention, once the applied electric field is increased above the resonance field and the resonance between levels 1 and 3 is thereby destroyed, there typically is still strong injection from the ground state of the injector into the upper lasing level of the adjacent downstream active region, allowing for a relatively wide dynamical range of current and concomitant relatively high optical power. Thus, in preferred embodiments of the invention the QWs and barriers of the injector are selected such that, at an applied bias field greater (typically significantly greater) than the resonance field at laser threshold, there is resonant injection of electrons from the ground state of the injector into the upper lasing level of the adjacent downstream active region. The above features are illustrated in FIG. 3, which shows the conduction band edge of the layer structure of FIG. 2 under an applied field of 65 kV/cm.

Figure 3:
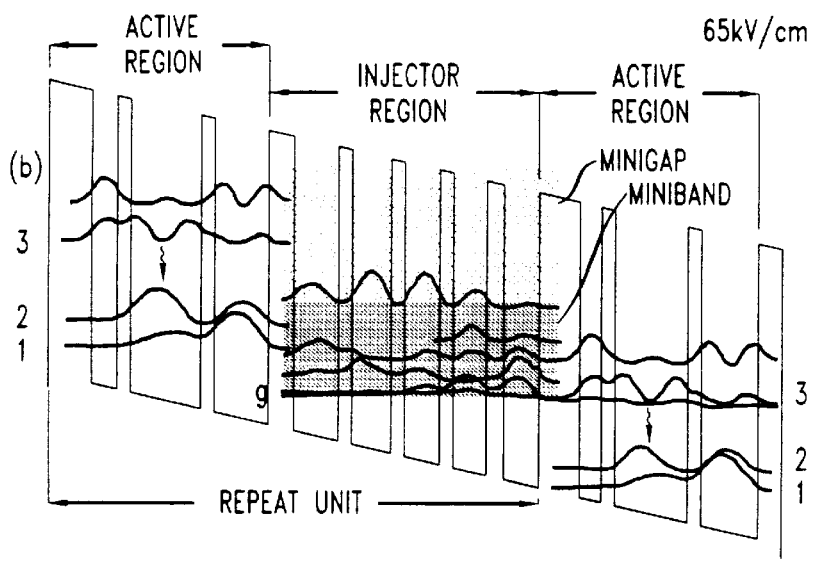

In FIG. 3, "g" refers to the ground state of the injector region. Electrons typically enter the injector region at an energy above that of the ground state but undergo relaxation to the ground state during transport to the adjacent downstream active region, such that the electrons can enter the upper laser state to undergo a further laser transition. For the exemplary structure under discussion, the first bias (45 kV/cm) corresponds to the resonance bias (and to the laser threshold), and the second bias (65 kV/cm) substantially corresponds to peak optical power.

In the exemplary QC laser according to the invention, 30 repeat units are disposed between conventional lower and upper optical confinement regions. With regard to examples of optical confinement regions, see, for instance, J. Faist et al, *Applied Physics Letters*, Vol. 70, p. 2670 (1997); C. Gmachl et al., *IEEE Photonics Technology Letters*, Vol. 9, p. 1090 (1997); C. Sirtori et al., *IEEE Photonics Technology*

Letters, Vol. 9, p. 294 (1997); and J. Faist et al., *Applied Physics Letters*, Vol. 68, p. 3680 (1996).

By way of example, in one embodiment of the invention the optical confinement regions consisted substantially of InP. As is known to those skilled in the art, use of InP in the upper confinement layer can, because of its relatively high thermal conductivity and advantageous other properties, lead to improved device performance (especially at higher cryogenic temperatures and above), as compared to ternary semiconductor material. In another embodiment of the invention the lower optical confinement region consisted substantially of InP and the upper optical confinement region consisted substantially of AlInAs and GaInAs. The upper and lower optical confinement layers and contacts were conventional.

After completion of MBE growth of the above recited layer structure, the wafers were processed in conventional fashion into ridge waveguide lasers, with stripe widths ranging from 11 to 17 $\mu$m. In one embodiment ("deep etched") the structure was etched to the bottom of the core region, and in another embodiment ("shallow etched") the structure was etched only to the bottom of the upper optical confinement region. After etching, deposition and patterning of an appropriate dielectric layer (e.g., silicon nitride, and deposition and patterning of metal contacts (e.g., Ti/Au for the upper contact and Ge/Au/Ag/Au for the lower contact), all in conventional fashion, the wafers were cleaved into bars, with widths ranging from 0.75–3 mm. The facets were left uncoated. After wire bonding of the lasers, the bars were mounted in a temperature controlled cold finger cryostat, and measurements were carried out.

Figure 4:
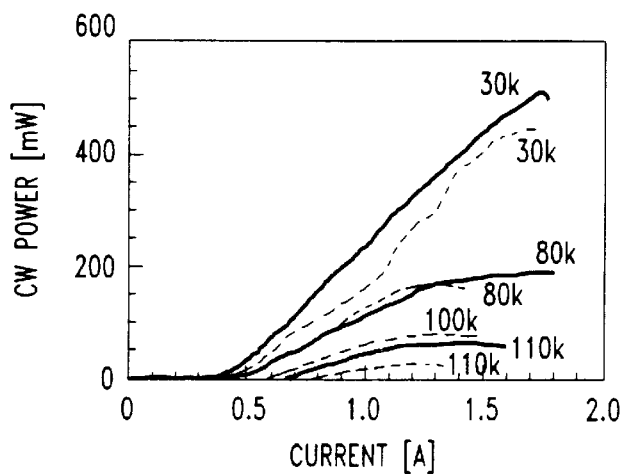
FIGS. 4 and 5 show data on light output power vs. drive current, for two exemplary QC lasers according to the invention.

FIG. 4 shows continuous wave (cw) light output vs. drive current, at various heat sink temperatures, for two deep-etched lasers of length 2.25 mm. The dashed lines were obtained from a laser with ternary top cladding, and the solid lines from a laser with InP top cladding. As can be seen from FIG. 4, the lasers had cw power of about 200 mW/facet at 80K, at 8 $\mu$m wavelength. This output power is closely comparable to the 5 $\mu$m output power of the QC laser described in the above cited paper by Faist et al., *IEEE J. Quantum Electronics*, Vol. 34, p. 336 (1998).

It was generally observed that QC lasers that emit at longer wavelengths (e.g., in the second atmospheric window that is important for gas sensing applications) have lower output power and power efficiency than QC lasers that emit at shorter wavelengths (e.g., 5 $\mu$m), due to the higher waveguide losses in the former. In fact, measurements of waveguide loss in QC lasers have shown that it increases approximately quadratically with wavelength, as is expected from free carrier absorption.

In view of the above discussed experimental facts, it is evident that the instant QC laser with 8 $\mu$m wavelength exhibits substantially improved output power, as compared to the prior art 5 $\mu$m QC laser.

Figure 5:
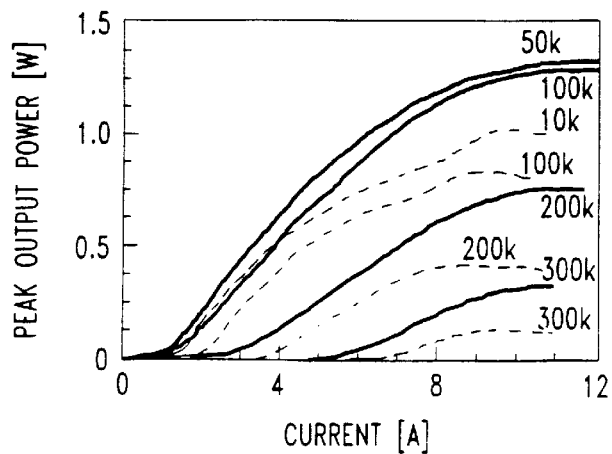

FIG. 5 shows peak output power vs. drive current, at various heat sink temperatures, for two shallow etched lasers of length 2.25 mm. The dashed lines were obtained from a laser with ternary top cladding, and the solid lines from a laser with InP top cladding. The lasers were operated in pulsed mode.

Figure 6:
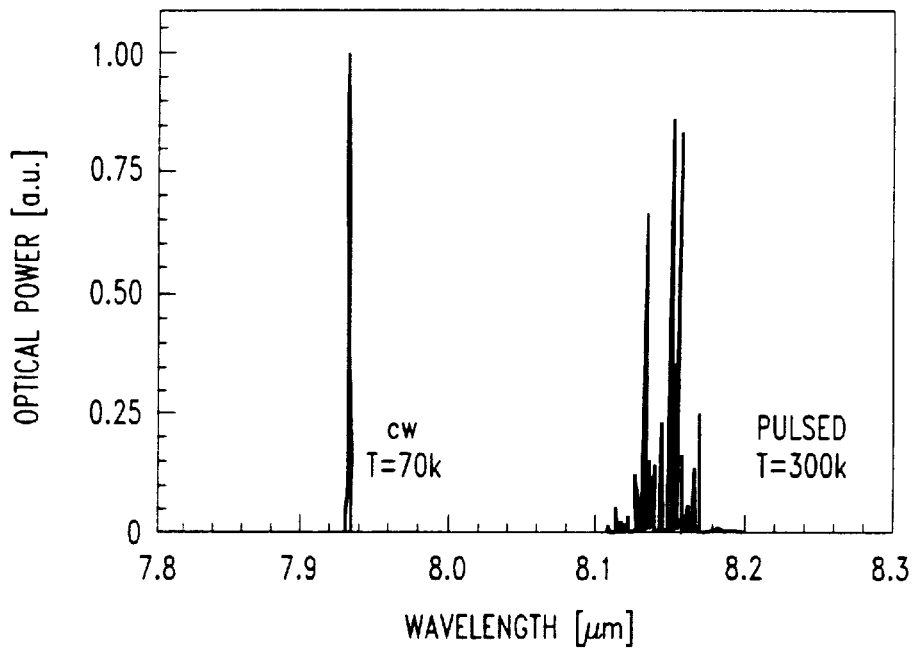
FIG. 6 shows optical power as a function of wavelength, under different operating conditions, for an exemplary QC laser according to the invention.

FIG. 6 shows the normalized emission spectra of QC laser as described above (width 13 $\mu$m, length 2.25 mm), measured close to laser threshold, cw and pulsed, respectively, at two different heat sink temperatures. The observed difference in the emission wavelengths reflects the temperature dependence of the gain spectrum of the lasers.

As those skilled in the art know, provision of distributed feedback can result in single mode output, and QC lasers according to the invention with distributed feedback are contemplated. For detail see, for instance, U.S. patent application Ser. No. 08/852,646, filed May 7, 1997 by J. N. Baillargeon et al., incorporated herein by reference.

Above, the invention is described in detail in terms of a particular embodiment, having a 3-QW active region, with "vertical" laser transition. However, the invention is not thus limited. For instance, the lasing transition could be "diagonal", the active region could be a superlattice active region. Although all such variants are currently not preferred, they are contemplated.

QC lasers are advantageously used for, inter alia, detection and/or monitoring of trace gases, for example, for pollution monitoring, process control, medical or law-enforcement purposes, since these lasers can have output in one of the so-called atmospheric "windows", i.e., at a wavelength at which the clean atmosphere essentially does not absorb radiation.

Figure 7:
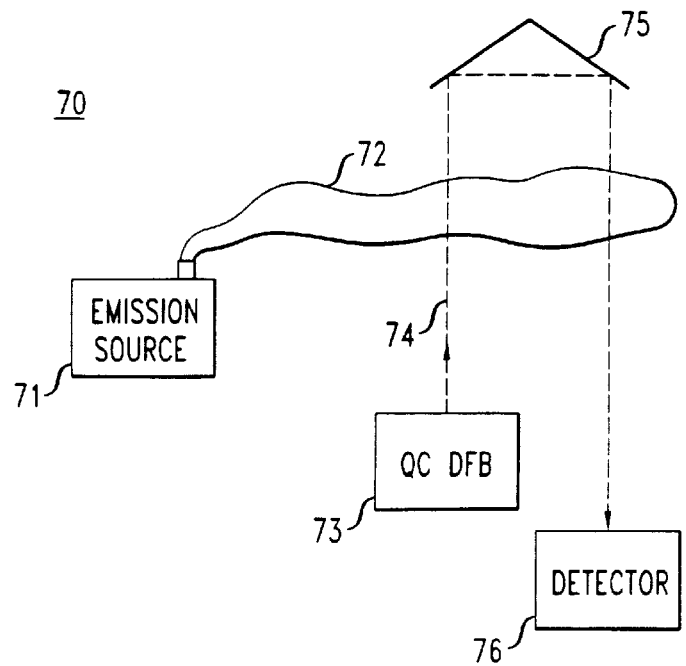
FIG. 7 schematically depicts an exemplary measuring or monitoring system comprising a QC laser according to the invention.

FIG. 7 schematically depicts an exemplary embodiment 70 of the invention, wherein an emission source 71 emits gas 72. QC laser 73 (advantageously a distributed feedback laser) emits mid-infrared radiation 74 that is directed through the emission gas, and is reflected, by any suitable means (e.g., corner reflector 75), to conventional detector 76. Of course, the reflector could be replaced with a detector, such that the absorption during a single pass is measurable.

The emission source is not necessarily a factory or other large-scale installation but could, for instance, be any source of a compound that has one or more absorption lines in the mid-IR. The source could, for instance, be a human subject, and the compound could be ethanol, or some medically significant compound. The gas sample could also be confined in a cell configured such that multi-path absorption is measured. For more detail on measurements, see the above-referenced '646 patent application.

The invention claimed is:

1. Article comprising a quantum cascade laser comprising, in sequence, an upper optical confinement region, a waveguide core region and a lower optical confinement region, and further comprising contacts for electrically contacting the laser; said waveguide core region comprising a multiplicity of essentially identical repeat units, a given repeat unit comprising an injector region and an active region selected to facilitate a radiative carrier transition from an upper to a lower energy state of the active region; said injector region comprising a multiplicity of quantum well layers, with barrier layers interleaved between said quantum well layers, said quantum well layers and barrier layers selected to facilitate, under appropriate electrical bias, charge carrier passage from a lower energy state of a given active region to the upper energy state of the immediately adjacent downstream active region;

characterized in that
said quantum well layers and barrier layers are selected such that, under a first applied bias, a lower energy level of a given active region is in resonance with the upper energy level of an adjacent downstream active region, such that carrier transfer from the lower energy level of the given active region to the upper energy level of the adjacent downstream active region is facilitated.

2. Article according to claim 1, wherein said quantum well layers and barrier layers furthermore are selected such that, under a second applied bias larger than the first applied bias, there is resonant charge carrier injection from the ground state of the injector region of the given repeat unit into the upper energy level of the active region of the adjacent downstream repeat unit.

3. Article according to claim 1, wherein said radiative carrier transition results in emission of a photon of wavelength in the wavelength range 3–13 μm.

4. Article according to claim 3, wherein said waveguide core region comprises 10 or more repeat units.

5. Article according to claim 3, wherein said upper optical confinement region comprises InP.

6. Article according to claim 3, wherein only some of the layers of the injector region of the given repeat unit are doped, with the remainder of the layers of the injector region being not intentionally doped.

7. Article according to claim 1, wherein said quantum cascade laser comprises a grating structure.

8. Article according to claim 1, wherein the article is a measurement system for measuring infrared radiation absorption by a measurement species, wherein the measurement system comprises a source of infrared laser radiation comprising a) a quantum cascade laser of claim 1; and the measurement system further comprises b) a detector for detecting the infrared laser radiation after passage through a quantity of said measurement species.

* * * * *